(12) United States Patent
Hou et al.

(10) Patent No.: US 6,271,082 B1
(45) Date of Patent: Aug. 7, 2001

(54) METHOD OF FABRICATING A MIXED CIRCUIT CAPACITOR

(75) Inventors: Chia-Hsin Hou, Hsinchu Hsien; Jyh-Kuang Lin, Hsinchu; Tz-Guei Jung, Hsinchu; Joe Ko, Hsinchu, all of (TW)

(73) Assignee: United Microelectronics Corp., Hsinchu (TW)

( * ) Notice: Subject to any disclaimer, the term of this patent is extended or adjusted under 35 U.S.C. 154(b) by 0 days.

(21) Appl. No.: 09/557,345

(22) Filed: Apr. 25, 2000

(30) Foreign Application Priority Data

Mar. 17, 2000 (TW) .............................. 089104920

(51) Int. Cl.[7] .............................. H01L 21/8242
(52) U.S. Cl. .............................. 438/250; 438/637
(58) Field of Search .............................. 438/239, 241, 438/250, 253, 393, 396, 634, 637

(56) References Cited

U.S. PATENT DOCUMENTS

| | | | |
|---|---|---|---|
| 5,631,188 | * | 5/1997 | Chang et al. .............................. 438/253 |
| 5,924,011 | * | 7/1999 | Huang .............................. 438/239 |
| 6,017,817 | * | 1/2000 | Chung et al. .............................. 438/637 |
| 6,171,899 | * | 1/2001 | Liou et al. .............................. 438/250 |

* cited by examiner

Primary Examiner—Chandra Chaudhari
(74) Attorney, Agent, or Firm—Thomas, Kayden, Horstemeyer & Risley, LLP

(57) ABSTRACT

A method for fabricating a capacitor is applicable to a fabrication process for a mixed circuit. The method involves forming a first dielectric layer, a stop layer, and a second dielectric layer on a substrate having a conductive region. A first opening is then formed in the second dielectric layer, followed by forming a second opening in the stop layer and the first dielectric layer, so that the first opening and the second opening form a dual damascene opening for exposing the conductive region. The dual damascene opening is filled with a first conductive layer, so as to form a via plug and a lower electrode of the capacitor for connecting to the conductive region. A third dielectric layer, which is located between the lower electrode and a subsequent formed upper electrode, is then formed over the substrate, so that the lower electrode and a part of the second dielectric layer adjacent to the lower electrode are completely covered by the third dielectric layer. A patterned second conductive layer is formed on a part of the third dielectric layer, whereby an upper electrode for completely covering the lower electrode is formed.

20 Claims, 6 Drawing Sheets

METHOD OF FABRICATING A MIXED CIRCUIT CAPACITOR

CROSS-REFERENCE TO RELATED APPLICATION

This application claims the priority benefit of Taiwan application serial no. 89104920, filed Mar. 17, 2000.

BACKGROUND OF THE INVENTION

1. Field of Invention

The present invention relates to a fabrication method for an integrated circuit (IC). More particularly, the present invention relates to a method of fabricating a mixed circuit capacitor.

2. Description of Related Art

A mixed circuit generally means a circuit having both a digital device and an analog device in a logic area of a semiconductor chip. The digital device can be an inverter, and an adder, whereas the analog device can be an amplifier, an analog/digital (A/D) converter, and so on. Typically, the mixed circuit has a capacitor structure therein for storing charges.

FIGS. 1A and 1B are schematic, cross-sectional diagrams illustrating a conventional method for fabricating a mixed circuit capacitor.

Referring to FIG. 1A, in the conventional fabrication process for the mixed circuit, a fabrication process for the capacitor begins with coating a metal layer 102 for forming a lower electrode on a substrate 100. Then, a dielectric layer 104 and a metal layer 106 for forming an upper electrode are formed in sequence on the metal layer 102, so that the dielectric layer 104 is located between the upper electrode and the lower electrode. The metal layer 106 and the dielectric layer 104 are patterned, followed by patterning the metal layer 102 so as to result formation of the capacitor, as shown in FIG. 1B.

The capacitor formed as described above has, in terms of area, a smaller upper electrode than the lower electrode, while the dielectric layer 104 is very thin. Therefore, an etching process can not stop on the dielectric layer 104, when the metal layer 106 is patterned to form the upper electrode. As a result, the dielectric layer 104 is usually etched through by an etching solution, so that a part of the metal layer 102 below the metal layer 106 is exposed. This produces a problem, such as a sidewall leakage.

SUMMARY OF THE INVENTION

The invention provides a fabrication method for a capacitor applicable to a fabrication process for a mixed circuit. The method comprises of forming in sequence a first dielectric layer, a stop layer, and a second dielectric layer on a substrate having a conductive region. A first opening is formed in the second dielectric layer, said opening is located above the conductive region. A second opening is then formed in the stop layer and the first dielectric layer, wherein the first opening and the second opening form a dual damascene opening which exposes the conductive region. The dual damascene opening is then filled with a first conductive layer so as to form a via plug and a lower electrode of the capacitor for connecting to the conductive region. A third dielectric layer, which is located between the lower electrode and a subsequently formed upper electrode, is formed over the substrate, so that the lower electrode and a part of the second dielectric layer adjacent to the lower electrode are completely covered by the third dielectric layer. A patterned second conductive layer is formed on a part of the third dielectric layer, whereby the upper electrode for completely covering the lower electrode is formed.

As embodied and broadly described herein, the invention provides a fabrication method for a circuit. The method comprises of forming in sequence a first dielectric layer, a stop layer, and a second dielectric layer on a substrate having a first conductive region and a second conductive region. A first opening is formed in the second dielectric layer, said opening is located above the first conductive region. A second opening is then formed in the stop layer and the first dielectric layer, wherein the first opening and the second opening are combined to form a dual damascene opening which exposes the conductive region. A third opening is then formed in the second dielectric layer, the stop layer, and the first dielectric layer, wherein the third opening exposes the second conductive region. The dual damascene opening and the third opening are then filled with a first conductive layer so as to form a first via plug and a lower electrode of the capacitor for connecting to the first conductive region, and a second via plug for connecting to the second conductive region. A third dielectric layer, which is located between the lower electrode and a subsequently formed upper electrode, is formed over the substrate, so that the lower electrode and a part of the second dielectric layer adjacent to the lower electrode are completely covered by the third dielectric layer. A patterned second conductive layer is formed on a part of the third dielectric layer, whereby the upper electrode for completely covering the lower electrode and a third conductive layer for connecting the second via are formed.

According to the present invention, the metal damascene process is adopted to fabricate the lower electrode of the capacitor and the via plug. Therefore, this prevents problems, such as an overlap error and a process bias that occur in the conventional fabrication process for the capacitor. Accordingly, both the device reliability and the process margin are improved.

Also, since the capacitor is formed using the metal damascene process in the dielectric layer having a planar surface, an overall surface of the semiconductor device remains planarized.

According to the present invention, the lower electrode is completely covered by the upper electrode which has a projection area larger than that of the lower electrode. So, the surface of the lower electrode is not exposed during the etching step for forming the upper electrode. Therefore, this prevents the occurrence of the sidewall leakage in the capacitor, when the dielectric layer and the lower electrode are etched through in the conventional process for patterning the upper electrode.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

FIGS. 2A to 2H are schematic, cross-sectional diagrams illustrating a fabrication method for a mixed circuit according to one preferred embodiment of this invention.

Figure 1A:
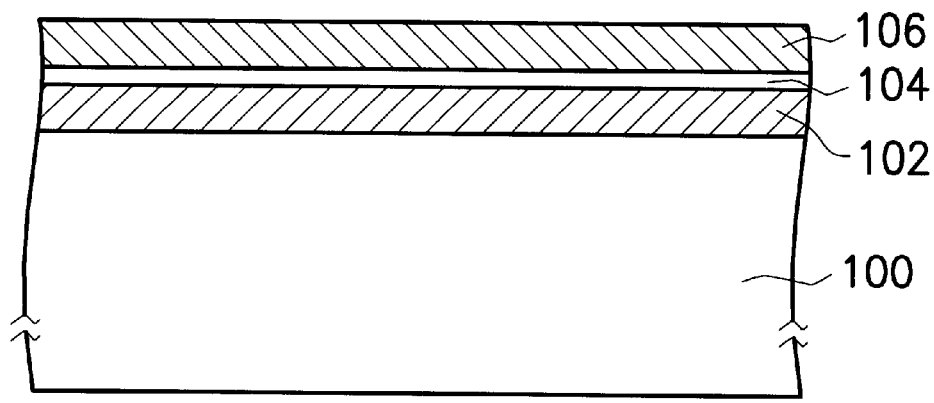
FIGS. 1A and 1B are schematic, cross-sectional diagrams illustrating a conventional method for fabricating a mixed circuit.
Figure 1B:
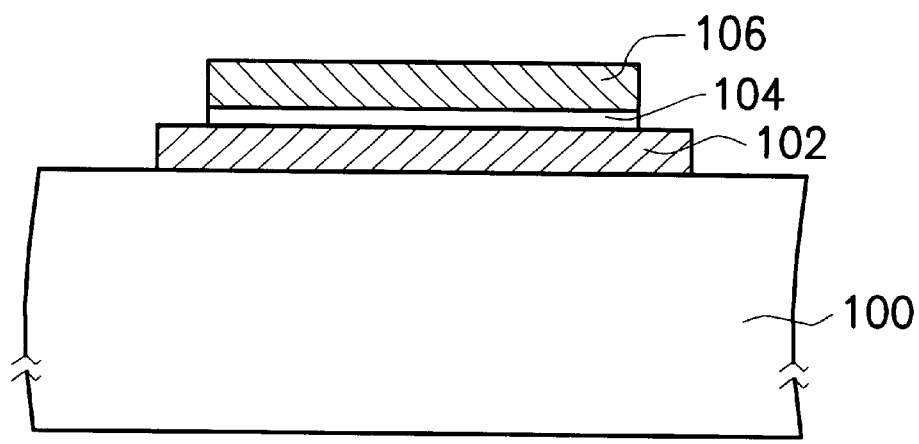
Figure 2A:
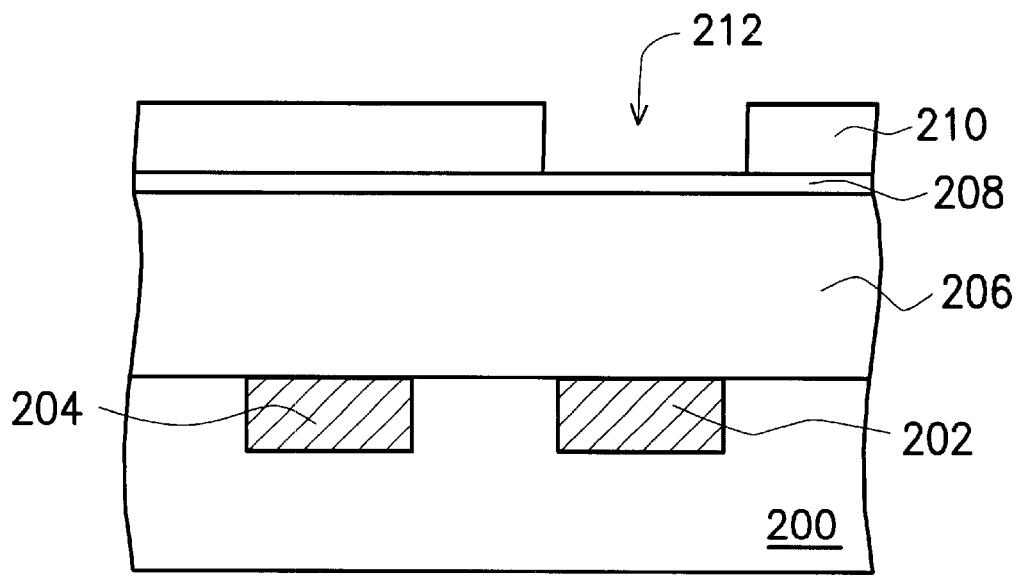
FIGS. 2A to 2H are schematic, cross-sectional diagrams illustrating a fabrication method for a mixed circuit according to one preferred embodiment of this invention.

Referring to FIG. 2A, a substrate 200 is provided, wherein the substrate 200 has a conductive region 202 and a conductive region 204. The conductive regions 202, 204 in this case, may be a source/drain region, a polysilicon layer or a metal layer. A dielectric layer 206, a stop layer 208, and another dielectric layer 210 are formed in sequence over the substrate 200. The dielectric layer 206 is made of materials such as silicon oxide, and the method for forming the dielectric layer 206 includes chemical vapor deposition (CVD). The stop layer 208 has a different etching rate from the dielectric layers 206, 210. The stop layer 208 is made of materials such as silicon nitride, and the stop layer 208 is formed by low pressure CVD (LPCVD) to a thickness of about 500–2000 angstroms. The dielectric layer 210 is made of materials such as silicon oxide, and the dielectric layer 210 is formed by CVD to a thickness of about 1000–2000 angstroms.

Referring to FIG. 2A again, the dielectric layer 210 is patterned so as to form an opening 212 therein to expose the stop layer 208, wherein the opening 212 is located above the conductive region 202. The method for patterning the dielectric layer 210 involves forming a patterned photoresist layer by a photolithographic process on the dielectric layer 210. The method is then followed by performing an etching process for the dielectric layer 210, with the photoresist layer serving as an etching mask, and the stop layer 208 serving as a etching stop.

Figure 2B:
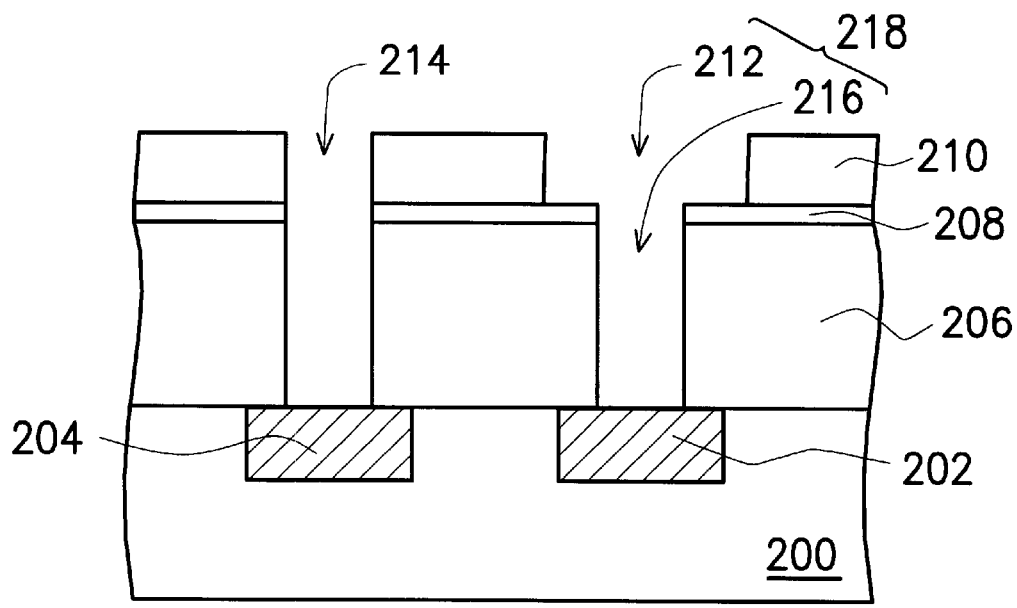

Referring to FIG. 2B, a via opening 214 for exposing the conductive region 204 is formed in the dielectric layer 210, the stop layer 208, and the dielectric layer 206 using a photolithographic and etching process. Meanwhile, an opening 216 is formed in the exposed part of the stop layer 208 and the dielectric layer 206 below the opening 212. As a result, the opening 212 and opening 216 form a dual damascene opening 218 for exposing the conductive region 202.

Although the opening 212 is formed before the via opening 214 and the opening 216 are simultaneously formed as described above, the steps of forming the openings 212, 216 and the via opening 214 should not be limited by the order described above. Rather, the steps can be of any order depending on a process specification.

Figure 2C:
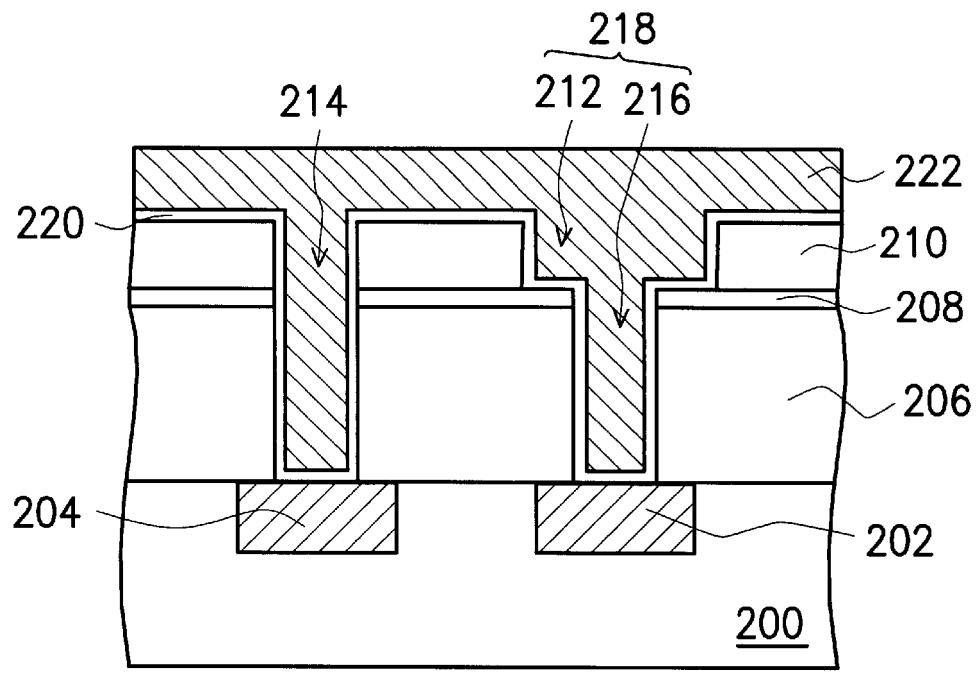

Referring to FIG. 2C, a conductive layer 222 is formed over the substrate 200 so as to fill the dual damascene opening 218 and the via opening 214 as well as to cover the dielectric layer 210 with the conductive layer 222. The conductive layer 222 includes metal, such as tungsten, and the conductive layer 222 is preferably formed by CVD. When the conductive layer 222 is made of metal, it is preferred to form a barrier layer 220 over the substrate 200, such that the barrier layer 220 covers the dielectric layer 210, a profile of the via opening 214, and a profile of the dual damascene opening 218. This prevents an inter-diffusion between the conductive layer 222 and the other materials. The barrier layer 220 preferably includes titanium (Ti)/TiN, TiN, or other materials having similar properties. The method for forming the barrier layer 220 includes CVD or sputtering.

Figure 2D:
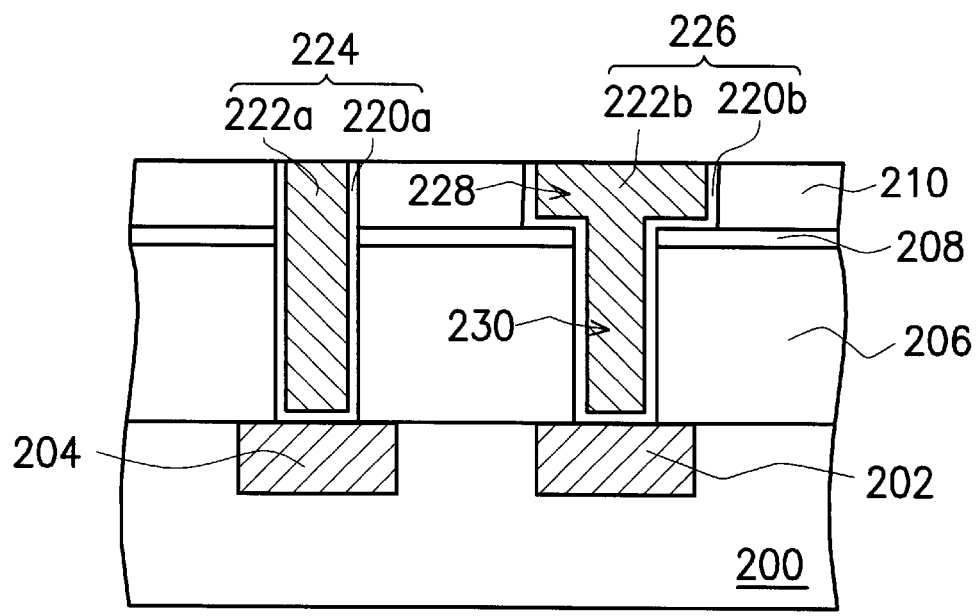

Referring to FIG. 2D, a portion of barrier layer 220 and the conductive layer 222 above the dielectric layer 210 is removed. The portion of barrier layer 220 and the conductive layer 222 above the dielectric layer 210 is preferably removed by a chemical mechanical polishing (CMP) process. As a result, the barrier layer and the conductive layer, indicated respectively as 220a and 222a in the diagram, remain in the via opening 214 to form a via plug 224 which connects to the conductive region 204. Furthermore, a dual damascene structure 226 is formed from the barrier layer and the conductive layer, indicated respectively as 220b and 222b in the diagram, that remain in the dual damascene opening 218. An upper portion 228 of the dual damascene structure 226 serves as a lower electrode of the capacitor in the mixed circuit, while a lower portion 230 of the dual damascene structure 226 serves as a via plug for connecting to the conductive region 202. Therefore, from herein after, the lower electrode of the capacitor is referred to a reference numeral of 228, while the via plug is referred to as 230.

Since the lower electrode 228 and the via plug 230 are formed using the metal damascene process. In other words, the lower electrode 228 and the via plug 230 are both formed simultaneously, instead of firstly forming the via plug 230 through a photolithographic and etching process, followed by forming the lower electrode 228 through another photolithographic and etching process. Therefore, this prevents problems, such as an overlap error and a process bias that occur in the conventional fabrication process for the capacitor. Accordingly, both the device reliability and the process margin are improved.

Also, the lower electrode 228 is formed using the metal damascene process in the dielectric layer 210 having a planar surface, so an overall surface of the semiconductor device remains planarized even after the step for forming the lower electrode 228 is performed. This positively enhances the subsequent photolithographic process.

Figure 2E:
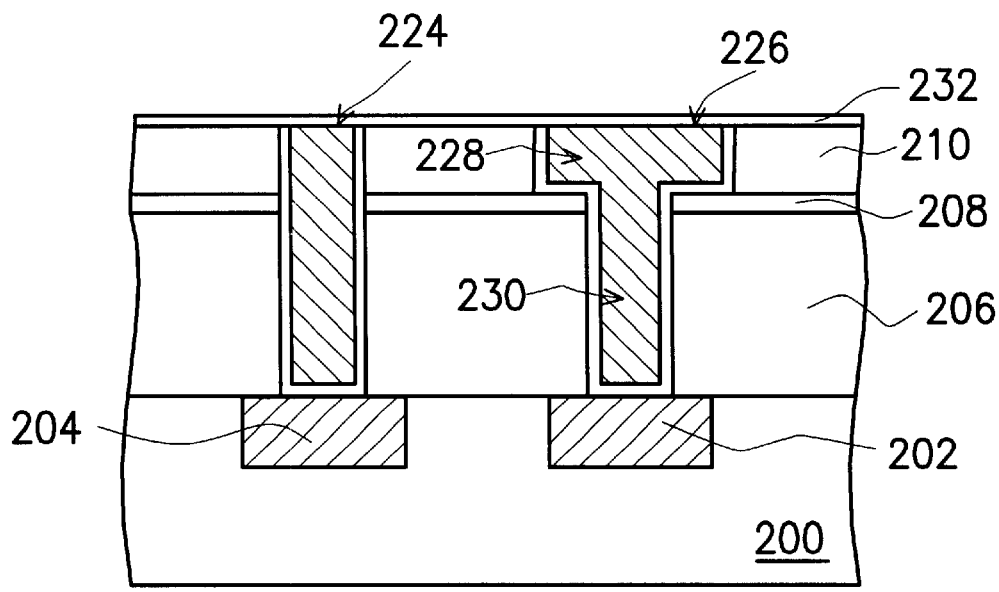

Referring to FIG. 2E, a dielectric layer 232 is formed over the substrate 200, so that the dielectric layer 232 serves as a dielectric layer between two electrodes in the capacitor. The dielectric layer 232 is made of material such as silicon oxide, silicon oxide/silicon nitride, or silicon oxide/silicon nitride/silicon oxide, and the dielectric layer 232 is formed by plasma enhanced CVD (PECVD) to a thickness of about 200–1000 angstroms.

Figure 2F:
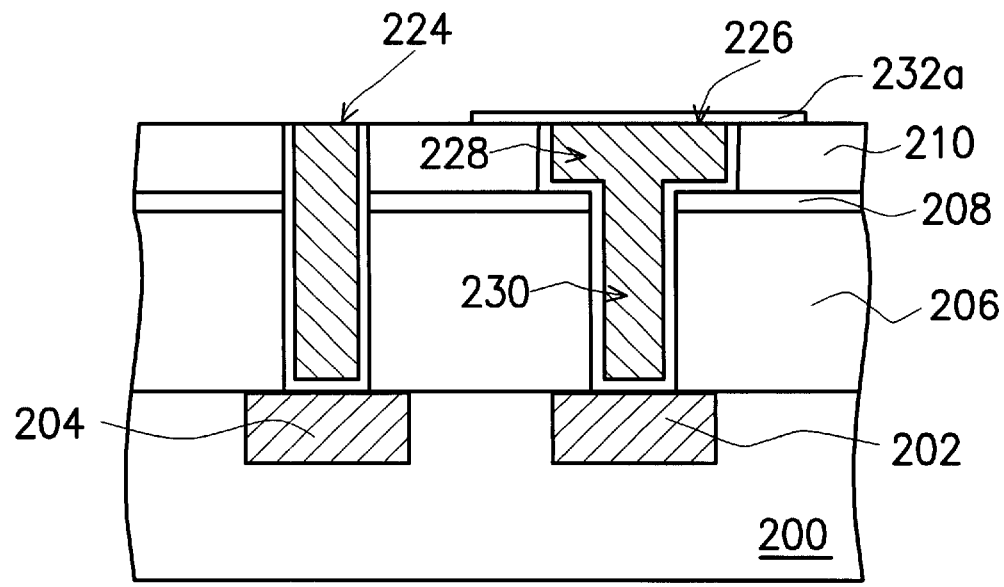

Referring to FIG. 2F, the dielectric layer 232 is patterned by a photolithographic and etching process, so as to remove a part of the dielectric layer 232 that covers the via plug 224 and a part of the dielectric layer 210, while the rest of the dielectric layer 232a remains. The dielectric layer 232a completely covers the lower electrode 228 and a portion of the dielectric layer 210 adjacent to the lower electrode 228. In other words, the dielectric layer 232a has a larger projection area than the lower electrode 228.

Figure 2G:
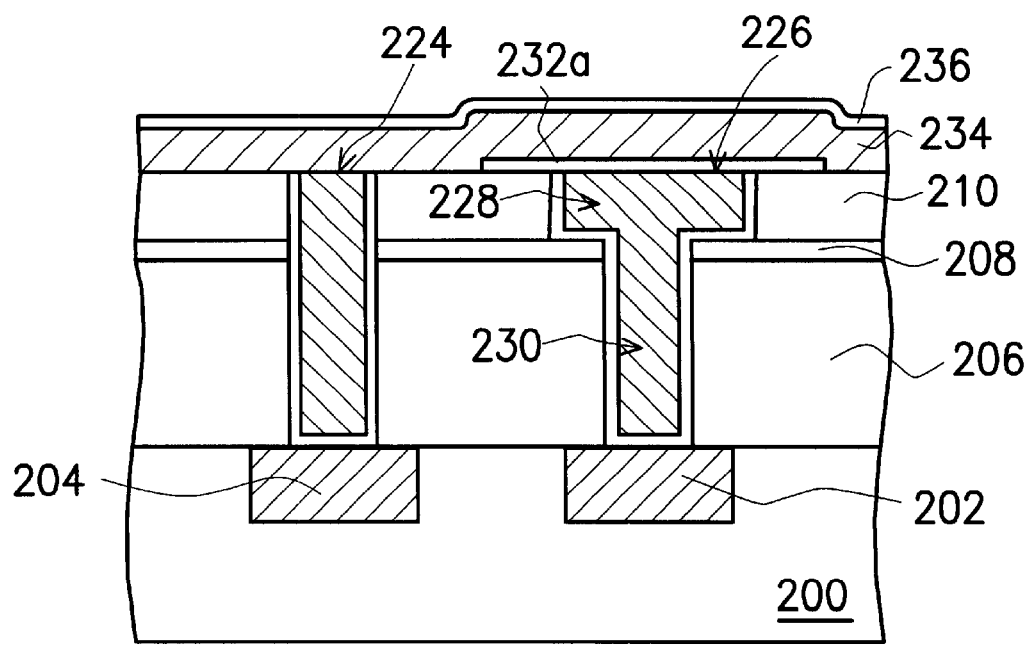

Referring to FIG. 2G, a conductive 234 is formed over the substrate, so as to cover the dielectric layer 210, the via plug 224, and the dielectric layer 232a. The conductive layer 234 is made of material such as aluminum (Al), and the conductive layer 234 is formed by sputtering to a thickness of about 2000–8000 angstroms. Preferably, a barrier layer 236 is formed on a surface of the conductive layer 234 after the conductive layer 234 is formed. The barrier layer 236 is made of material such as Ti/TiN, and the method for forming the barrier layer 236 includes sputtering or CVD.

Figure 2H:
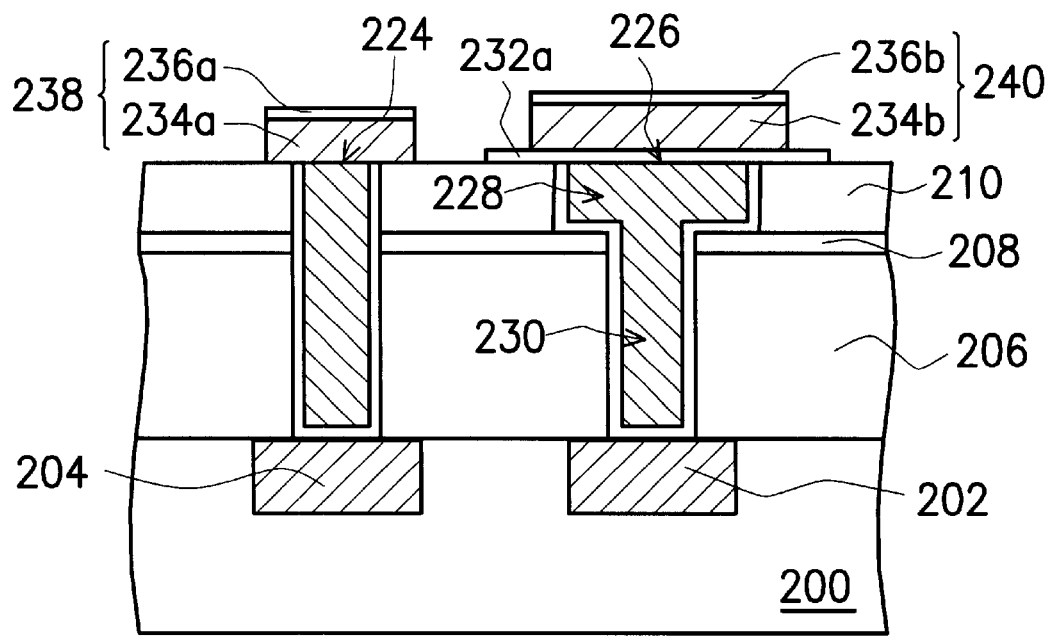
Figure 3:
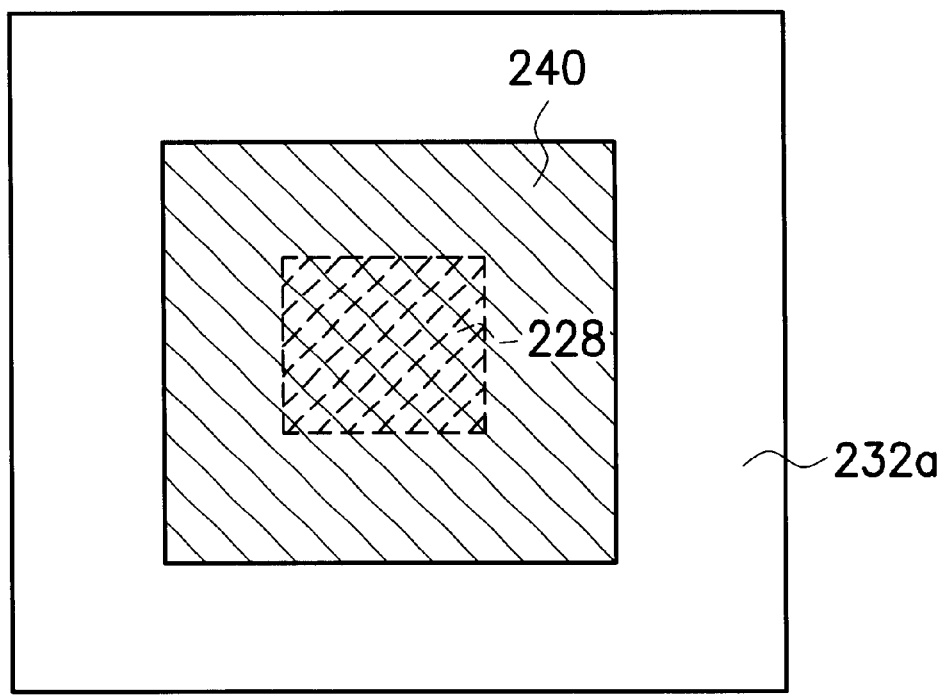
FIG. 3 is a schematic diagram illustrating a top view for an upper electrode, a dielectric layer, and a lower electrode of the capacitor in FIG. 2H.

Referring to FIG. 2H, the conductive layer 234 and the barrier layer 236 are patterned using a photolithographic and etching process. As a result, the via plug 224 is covered by a patterned conductive layer 234a and barrier layer 236a, while the dielectric layer 218a is covered by another patterned conductive layer 234b and barrier layer 236b. The patterned conductive layer 234a and barrier layer 236a serve as a conductive line 238 which connects to the conductive region 204 by the via plug 224. The patterned conductive layer 234b and barrier layer 236b serve as an upper electrode 240 of the capacitor. FIG. 3 illustrates a top view of the upper electrode 240, the dielectric layer 232a, and the lower electrode 228. The dielectric layer 232a has an area which is larger than either an area of the upper electrode 240 or an area of the lower electrode 228, while the upper electrode 240 completely covers the lower electrode 228. The upper electrode 240 has a projection area which is smaller than that of the dielectric layer 232a, but the upper electrode 240 has a projection area which is larger than that of the lower electrode 228.

The patterned conductive layer 234b and barrier layer 236b have a smaller projection area than the dielectric layer 232a, while the dielectric layer 232a has a different etching rate from the conductive layer 234 and the barrier layer 236. Therefore, the etching step for patterning the conductive layer 234 and the barrier layer 236 can stop on the dielectric layer 232a. Also, the lower electrode 228 has a smaller projection area than the patterned conductive layer 234b and barrier layer 236b, so instead of the lower electrode 228, the dielectric layer 210 is exposed even when the dielectric layer 232a is too thin to prevent an etch-through. According to the above embodiment, the lower electrode 228 is not exposed during the etching step for patterning the conductive layer 234 and barrier layer 236. Thus, the sidewall leakage problem in the capacitor, when the dielectric layer and the lower electrode are etched through in the conventional process for patterning the upper electrode is prevented.

Summarizing the above, the invention has several advantages as follows. Since the lower electrode and the via plug are formed using the metal damascene process, problems, such as an overlap error and a process bias that occur in the conventional fabrication process for the capacitor, are prevented. Accordingly, both the device reliability and the process margin are improved. Also, the lower electrode 228 is formed using the metal damascene process in the dielectric layer 210 having a planar surface, so an overall surface of the semiconductor device remains planarized. As the upper electrode completely covers the lower electrode, wherein the upper electrode has a larger projection area than the lower electrode, the lower electrode is not exposed in the etching step for patterning the upper electrode. Thus, the sidewall leakage problem in the capacitor, when the dielectric layer and the lower electrode are etched through in the conventional process for patterning the upper electrode is prevented.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A fabrication method for a capacitor, applicable to a fabrication process for a mixed circuit, the method comprising:

providing a substrate, said substrate having a conductive region;

forming a first dielectric layer on the substrate;

forming a stop layer on the first dielectric layer;

forming a second dielectric layer on the stop layer;

forming a first opening in the second dielectric layer, and forming a second opening in the stop layer and the dielectric layer, wherein the first opening and the second opening form a dual damascene opening for exposing the conductive region; filling the dual damascene opening with a first conductive layer so as to form a via plug and a lower electrode for connecting to the conductive region;

forming a patterned third dielectric layer on the lower electrode and a portion of the second dielectric layer; and forming a patterned second conductive layer on a part of the third dielectric layer whereby an upper electrode is formed, said upper electrode completely covering the lower electrode.

2. The fabrication method of claim 1, wherein the conductive region includes an active region.

3. The fabrication method of claim 1, wherein the conductive region includes a polysilicon layer.

4. The fabrication method of claim 1, wherein the conductive region includes a metal layer.

5. The fabrication method of claim 1, wherein the method for forming the dual damascene opening further comprising:

patterning the second dielectric layer using a photolithographic and etching process so as to form first opening, said first opening exposing the stop layer and is located above the conductive region; and patterning the first dielectric layer using a photolithographic and etching process, so as to form a second opening, said second opening exposing the conductive region.

6. The fabrication method of claim 1, wherein the step of filling the dual damascene opening with a first conductive layer comprising:

forming a first conductive material for covering a profile of the dual damascene opening and the second dielectric layer; and removing a portion of the first conductive layer on the second dielectric layer.

7. The fabrication method of claim 6, wherein the step of removing a portion of the first conductive layer on the second dielectric layer includes chemical mechanical polishing (CMP).

8. The fabrication method of claim 6, wherein the first conductive material includes metal.

9. The fabrication method of claim 8, further includes forming a conformal barrier layer for covering a profile of the dual damascene opening and the second dielectric layer before the step of forming metal in the dual damascene opening.

10. The fabrication method of claim 9, wherein the metal includes tungsten and the barrier layer includes titanium nitride.

11. The fabrication method of claim 1, wherein the step of forming the upper electrode comprising:

forming a second conductive layer on the substrate; and patterning the second conductive material using a photolithographic and etching process so as to form the upper electrode, wherein the upper electrode has a projection area larger than that of the lower electrode.

12. The fabrication method of claim 1, wherein the stop layer includes silicon nitride.

13. A fabrication method for a mixed circuit, comprising:

providing a substrate, said substrate having a first conductive region and a second conductive region;

forming a first dielectric layer on the substrate;

forming a stop layer on the first dielectric layer;

forming a second dielectric layer on the stop layer;

forming a first opening in the second dielectric layer, said first opening is on the first conductive region;

forming a second opening in the stop layer and the dielectric layer, wherein the first opening and the second opening form a dual damascene opening for exposing said first conductive region;

forming a third opening in the second dielectric layer, the stop layer, and the first dielectric layer, said third opening exposing the second conductive region;

filling the dual damascene opening and the third opening with a first conductive layer so as to form both a via plug for connecting to the first conductive region and a lower electrode and a second via plug for connecting the second conductive region;

forming a patterned third dielectric layer on the substrate, said patterned third dielectric layer completely covering the lower electrode and a portion of the second dielectric layer adjacent to the lower electrode;

forming a patterned second conductive layer on a part of the third dielectric layer whereby an upper electrode is formed, said upper electrode completely covering the lower electrode;

forming a patterned third conductive layer on the substrate, said third conductive layer connecting to the second via plug.

14. The fabrication method of claim 13, wherein the method for forming the first opening, the second opening, and the third opening further comprising:

patterning the second dielectric layer using a first photolithographic and etching process so as to form first opening, said first opening exposing the stop layer and is located above the first conductive region; and patterning the second dielectric layer, the stop layer, and the first dielectric layer using a second photolithographic and etching process, so as to form the second opening and the third opening.

15. The fabrication method of claim 13, wherein the method for forming the first via plug, the lower electrode, and the second via plug comprising:

forming a first conductive material for covering a profile of the dual damascene opening, the third opening, and the second dielectric layer; and removing a portion of the first conductive layer on the second dielectric layer.

16. The fabrication method of claim 15, wherein the step of removing a portion of the first conductive layer on the second dielectric layer includes chemical mechanical polishing (CMP).

17. The fabrication method of claim 16, wherein the first conductive material includes metal.

18. The fabrication method of claim 17, further includes forming a conformal barrier layer in the dual damascene opening and the third opening and on the second dielectric layer before the step of forming the first conductive material in the dual damascene opening.

19. The fabrication method of claim 18, wherein the first conductive material includes tungsten and the conformal barrier layer includes titanium nitride.

20. The fabrication method of claim 13, wherein the step of forming the upper electrode and the patterned third dielectric layer comprising:

forming a second conductive layer on the substrate; and patterning the second conductive material using a photolithographic and etching process so as to form the upper electrode and the patterned third dielectric layer, wherein the upper electrode has a projection area larger than that of the lower electrode.

* * * * *